United States Patent [19]

Choi et al.

[11] Patent Number: 4,826,783

[45] Date of Patent: May 2, 1989

[54] METHOD FOR FABRICATING A BICMOS DEVICE

[75] Inventors: Suki-Gi Choi, Seoul; Sung-Ki Min, Inchon; Chang-Won Kahng, Seoul, all of Rep. of Korea

[73] Assignee: Samsung Semiconductor and Telecommunications Co., Ltd., Gumi, Rep. of Korea

[21] Appl. No.: 106,582

[22] Filed: Oct. 8, 1987

[30] Foreign Application Priority Data

Nov. 4, 1986 [KR] Rep. of Korea ............... 86-9286

[51] Int. Cl.[4] ............................................. H01L 21/70
[52] U.S. Cl. ....................................... 437/57; 437/56; 357/43; 148/DIG. 9
[58] Field of Search ............... 437/31, 32, 34, 56, 437/57; 357/43, 34, 35; 156/643; 148/DIG. 9, DIG. 10, DIG. 11

[56] References Cited

U.S. PATENT DOCUMENTS

| | | | |
|---|---|---|---|
| 3,920,484 | 11/1975 | Ogura | 148/1.5 |
| 4,045,250 | 8/1977 | Dingwall | 148/1.5 |
| 4,325,180 | 4/1982 | Curran | 29/571 |
| 4,503,603 | 3/1985 | Blossfeld | 437/31 |
| 4,637,125 | 1/1987 | Iwasaki et al. | 437/59 |

OTHER PUBLICATIONS

Choi et al., "A Cost-Performance Optimized BiCMOS Process for LSI Circuit Applications", Presented at First Internation BiCMOS Symposium, ECS Meeting, Philadelphia, May, 1987.

*Primary Examiner*—Brian E. Hearn
*Assistant Examiner*—M. Wilczewski
*Attorney, Agent, or Firm*—Ladas & Parry

[57] ABSTRACT

This invention provides a method for fabricating a BiCMOS device, in which said device has a Si substrate of a first conductivity in which there is formed a first substrate region of a second conductivity for a bipolar transistor, a second substrate region of said second conductivity for a first MOSFET, having a source and drain of the first conductivity, and in which a part of said Si substrate is formed to provide a second MOSFET which has a source and drain of the second conductivity. A first nitride layer is used to prevent the substrate under a masking layer from oxidizing during the following oxidation processes, wherein the masking layer is composed of a oxide layer and the nitride layer. After some processes, the masking layer is removed. Implanting As impurities, a new oxide layer and a new nitride layer are deposited, wherein the role of the nitride layer is to protect a shallow emitter region. After that, a new clean oxide layer is grown for a gate insulator layer, and controllable clean gate oxide layer is obtained.

4 Claims, 5 Drawing Sheets

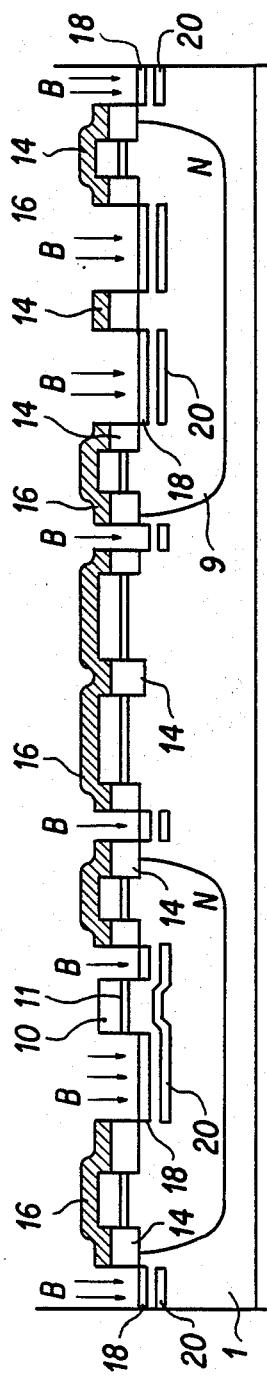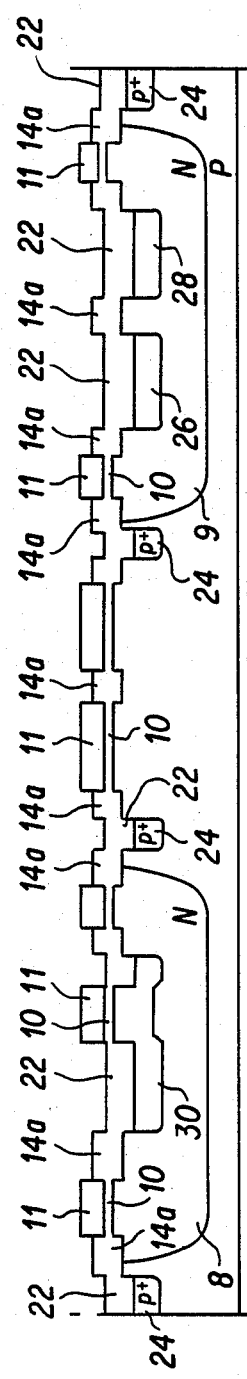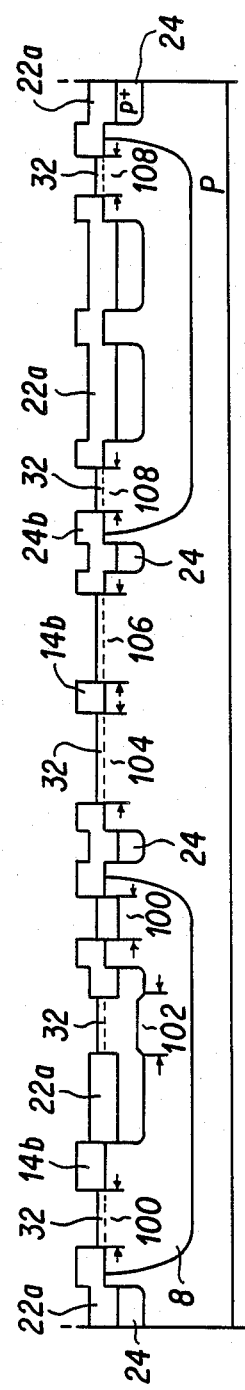

METHOD FOR FABRICATING A BICMOS DEVICE

BACKGROUND OF THE INVENTION

This invention relates to a method for fabricating a semiconductor device having bipolar transistors and N and P channel MOS (CMOS) field effect transistors (FETs) on the same Si substrate.

A semiconductor device that has both bipolar transistors and CMOS transistors is generally called as a BiCMOS device.

A method for fabricating a BiCMOS device on a Si substrate is disclosed in, e.g., U.S. Pat. No. 4,503,603. This process is based on fabricating steps that use a first dielectric layer on the Si substrate that later serves as the gate oxide (insulator) of the finished FETs. The dielectric layer remains unchanged throughout the process in which it forms a part of a masking layer composed of the first dielectric layer, which is $SiO_2$ and a second, nitride dielectric layer. The dielectric layers are formed on the substrate while defining on the substrate regions (wells) of a first conductivity type and a second conductivity type, which is the reverse of the first conductivity type, for fabricating the bipolar transistors and MOSFETs on the Si substrate.

Thus, this conventional process needs the following 8 mask steps:

A first mask step to define the regions (wells) of the second conductivity type on the substrate. A second mask step which makes the above-described first dielectric layer over the whole substrate except for the emitter and collector contact regions of the bipolar transistor, the gate region of the P channel MOSFET and source and drain regions adjacent to the gate and their contact regions to provide back bias to the substrate of PMOS FET and the NMOS FET regions. A third mask step to mask against ion implantation to form the base region of bipolar transistor, the source and drain of PMOS FET, and the contact regions on the substrate in the first conductivity. A fourth mask step to mask against the ion implantation to form the collector, emitter and contact regions of the substrate for the PMOS FET and the source and drain for the NMOS FET. A fifth mask step to provide ion implantation for the source and drain of NMOS FET, which are adjacent to its gate to form its channel region. A sixth and a seventh mask step to define the contact regions and their interconnection, and an eighth mask step to interconnect the contact regions after masking a passive, protective layer on the surface.

So, with the traditional method, there are:

(1) unstable threshold voltages caused by the non-uniform distribution of impurities after the successive etching and oxidation processes associated with the above mask steps, because the gate insulators of the CMOS FETs are covered by the second, nitride dielectric layer as a mask against the oxidation processes;

(2) disadvantages that the electrical characteristics of the CMOS FETs are controlled by the conditions of the bipolar transistor fabrication process; and (3) many mask steps, which may even increase to 10 mask steps to provide the separate masking required if ion implantation is used to control the threshold voltage of the PMOS and NMOS FETs too.

SUMMARY OF THE INVENTION

An object of this invention is to provide a method for fabricating a stable MOS FET by using a good insulator as the gate dielectric of a CMOS FET.

Another object of this invention is to provide the above method with easy control of threshold voltages of the CMOS FET.

Still another object of this invention is to minimize the number of mask steps in a method of fabrication of a BiCMOS to make it economic.

BRIEF DESCRIPTION OF THE DRAWINGS

FIGS. 2 to 11 are cross-sectional views of the process steps in accordance with the invention taken along with line A—A in FIG. 1.

DETAILED DESCRIPTION OF THE INVENTION

Figure 1:
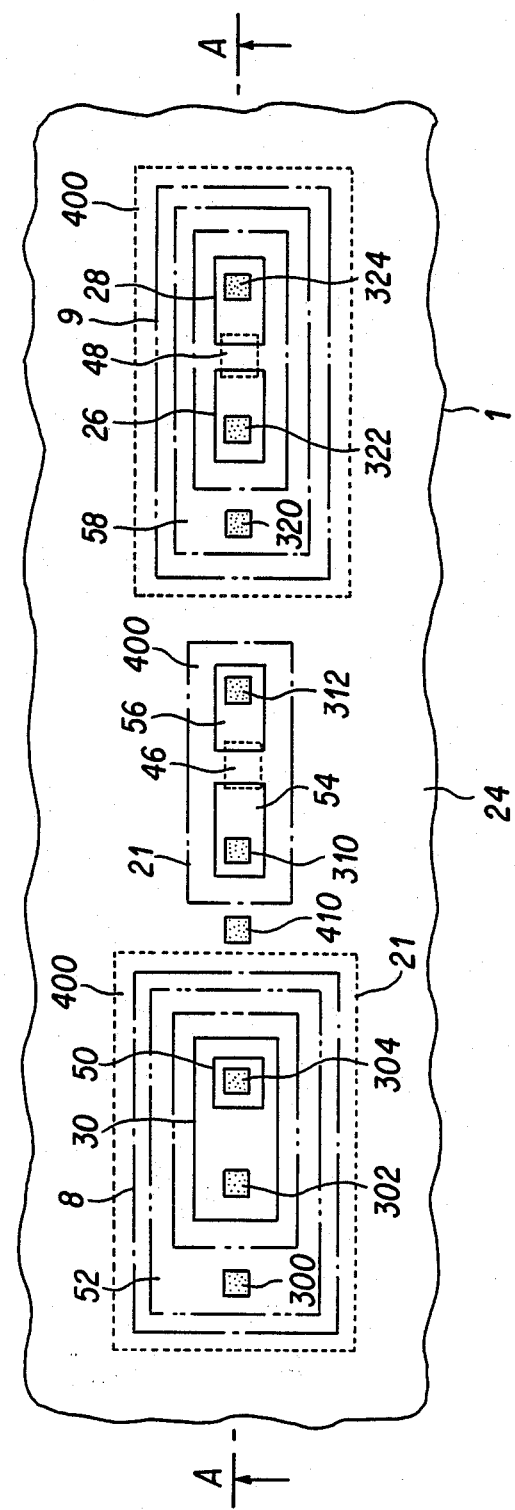
FIG. 1 is a plan view of a BiCMOS mode in accordance with the invention.

FIG. 1 is a plan view of a BiCMOS made in accordance with the invention.

The starting material is a p-type <111>Si for a substrate 1 with a resistivity of 1–20Ω-cm. NPN transistors, PMOS FETs and NMOS FETs (one each shown), are formed on the Si substrate 1, which, in its entirety (not shown), is a wafer.

In FIG. 1, there is a first substrate region 8 in which an NPN transistors is formed, a second substrate region 21 in which an NMOS FET is formed and another substrate region 9 in which a PMOS FETs are formed. A P+ channel stopping region 24 is outside border zones 400 of each of the former substrate regions 8, 9, 21 to prevent the formation of channels between the devices of the respective substrate regions. An opening 410 in the channel stopping region 24 provides ohmic contact for the channel stopping region.

In the first substrate region 8 are the collector region 52, the base region 30 and the $N^{30}$ emitter region 50 for the NPN transistor. The collector region 52, of proper depth, surrounds the base region 30 at a certain spacing across the surface of the substrate region 8. The $N^{30}$ emitter region 50 is within the base region 30. Openings 300, 302, 304 are provided as contact regions in the collector, base and $N^{30}$ emitter regions, respectively.

A gate insulator 46 is formed in the second substrate region 21, in which the NMOS FETs is fabricated, on the same, upper surface of the substrate 1, between a source region 54 and a drain region 56 for the NMOS FET. Openings 310, 312 respectively in the latter are contact openings for the source and drain regions 54, 56, respectively.

In the other substrate region 9, for the PMOS FET, a region (not referenced) which is to apply the bias for substrate region 9, surrounds a $P^{30}$ source 26 and a separate $P^{30}$ drain 28. Also in the bias region, between the separated source and drain 26, 28 is a gate insulator 48. A contact zone 58 surrounds the bias region. Openings 320, 322, 324 are in the contact zone 58, source 26 and drain 28 for respective contacts therefor.

FIG. 2 to FIG. 11 are cross-sectional views of the process steps in accordance with the invention taken along line A—A in FIG. 1 for making the BiCMOS thereof. The process steps for making the BiCMOS according to the invention will now be explained.

Figure 2:
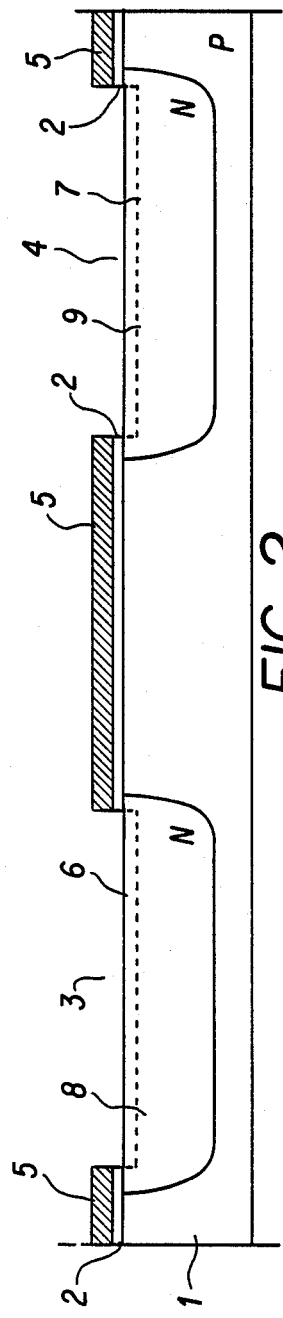

After forming a $SiO_2$ layer 2 by the conventional oxidation method over a surface of the substrate 1 as shown in FIG. 2, a photoresist 5 is coated over portions thereof to make openings 3, 4 for the NPN transistor and the PMOS FET, respectively, by conventional photolithography and N-type implanted regions 6, 7 are made therein by high energy ion implantation of phosphorous to a dose of $10^{12} - 10^-$ions/cm$^2$.

Figure 3:
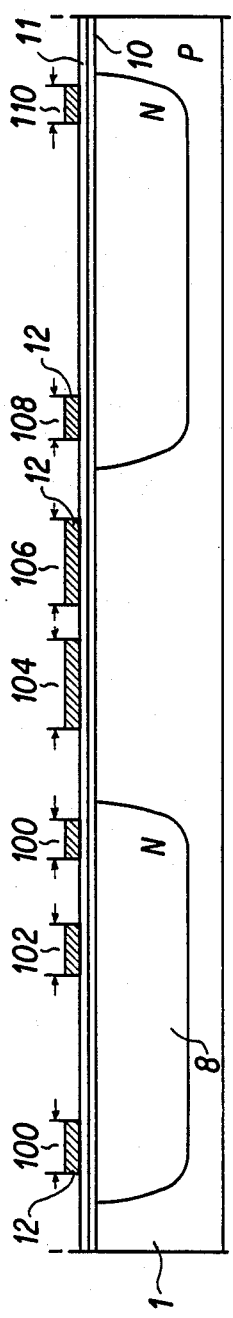

After removing the photoresist 5, which also served as a mask against ion implantation as shown in FIG. 3, the N-type implanted regions are activated by heating to about 1200° C. in nitrogen gas to form the first N+ substrate region 8 and the other N+ substrate region 9 to a diffusion depth of about 2.5 μm. A thin oxide layer 10 is then formed over the surface of the substrate 1, as also shown in FIG. 3, after removing the rest of the oxide layer 2 from the substrate 1. A thin Si$_3$N$_4$ layer 11 is formed over the oxide layer 10 by a conventional LPCVD (Low Pressure Chemical Vapor Deposition) process. The masking layer composed of the oxide layer 10 and the nitride layer 11 prevents further oxidation of the surface of the substrate 1 under said masking layer during the following oxidation processes, until said masking layer is removed.

For the latter, a second photoresist mask 12 is placed on portions of the nitride layer 11. The mask 12 covers the collector regions 100 and the emitter region 102 in the first substrate region 8, which is to form the NPN transistor, the source and drain 104, 106 in the second substrate region 21, which are to form the NMOS FET, and the contact regions 108, 110 of the second substrate region 9, which is to form PMOS FET.

Figure 4:
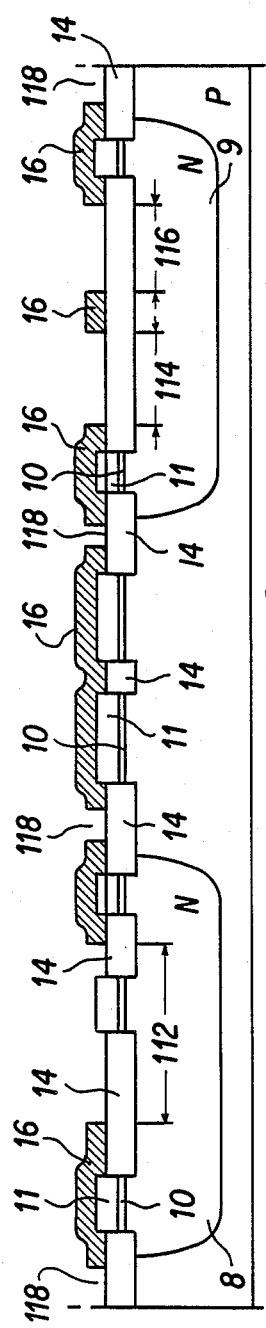

After etching away the rest of the nitride layer 11, which is not masked by the second mask 12, and removing the second mask 12, a second oxide layer 14 is formed as shown in FIG. 4 for a third photolthography. In this oxidation process, the oxide layer 14 is not formed on the regions of the Si substrate under the masking layers 10, 11, i.e. where the second mask 12 was, but on the regions masked thereby. After growing the second oxide layer 14, the surface of the substrate except the regions 112 for the base of the NPN transistor, 114, 116 for the source and drain of the PMOS FET and 118 for the channel stopper are covered by a third photoresist mask 16 as also shown in FIG. 4.

The layers on the surface of the substrate 1 and, particularly, those at the bipolar and PMOS substrate regions 8, 9 are then revealed by etching away regions of the second oxide layer 14 with the photoresist mask 16 as an etch mask to achieve the structure shown in FIG. 5. After this, two boron implantations are performed using the third mask, oxide and masking layers 16, 14, 10, 11 and remaining thereunder as masks against ion implantation thereat. The two boron implantations are performed with respectively different energies. The first implantation is performed with a high dose at an energy of less than 100 KeV and the second, is performed with dose $2 \times 10^{12} - 5 \times 10^{13}$ ions/cm$^2$ at a higher energy, which is high enough to penetrate the oxide and nitride layers 10, 11 and into the substrate to a junction depth of about 0.5 μm. The above implantation sequence can be reversed. The first implantation, with relatively low energy, cannot penetrate the masking layers 10, 11 on the emitter region 102 (FIG. 3) of the NPN transistor, which is not masked by the third mask 16, but the second implantation with high energy, can penetrate these layers. The energy of the second implantation is, therefore, varied so that the boron concentration of the base region under the emitter region can be controlled. Then, as shown in FIG. 5, the first implantation produces P+ regions 18, implanted with low energy and high concentration, and the second implantation produces a P+ regions 20, implanted with high energy and low concentration.

After the third mask 16 is then etched away by plasma etching, an oxidizing process, such as the conventional method used for making masks 10, 11, forms a third oxide layer 22 on silicon surfaces exposed by the plasma etching process, as shown in FIG. 6, and reforms the second oxide layer 14 of FIG. 5 into the oxide layer 14a of FIG. 6, which has a prescribed thickness. Also during this process the P+ region 18 of high-concentration boron implantation and the P region 20 of low concentration boron implantation are activated so that channel formation between devices thereat is prohibited, P+ channel stop regions surrounding the NPN transistor and N channel and P channel FET devices are formed, source and drain regions 26, 28 are formed in the substrate region 9 for the P channel FET, and an activated base region 30 is formed in the bipolar substrate region 8. The portion of the base region 30 which is not under the emitter region 102 (FIG. 3) is deeper in depth and has a higher concentration than that under the emitter region 102 so that it is easy to reduce the base resistance and to improve the electrical characteristics of NPN transistor formed thereat.

Then, after removing the nitride layer 11 by a conventional method of etching the nitride without a mask, the thin oxide layer 10 is etched away with a HF solution, without any mask, so as to reveal the surface of the substrate 1 under the masking layers 10, 11 of FIG. 6 as shown in FIG. 7. In this step, too, the reformed second oxide layer 14a and the third oxide layer 22 of FIG. 6 become new oxide layers 14b, 22a, because etched away by the thicknesses of the first oxide layer 10.

After that, as also shown in FIG. 7, an As implantation to a dose of $10^{15} - 10^{16}$ ions/cm$^2$ is performed, using the new oxide layers 14b, 22a as a mask. The As is implanted as a layer having a junction depth about 0.3 μm in the collector region 100 and the emitter 102 of the NPN transistor region 8, in the source and drain regions 104, 106 of the NMOS FET region 21 (FIG. 1) and in the contact region 108 of the PMOS FETs region 9 so that high emitter efficiency and low ohmic resistance can be obtained.

Figure 8:
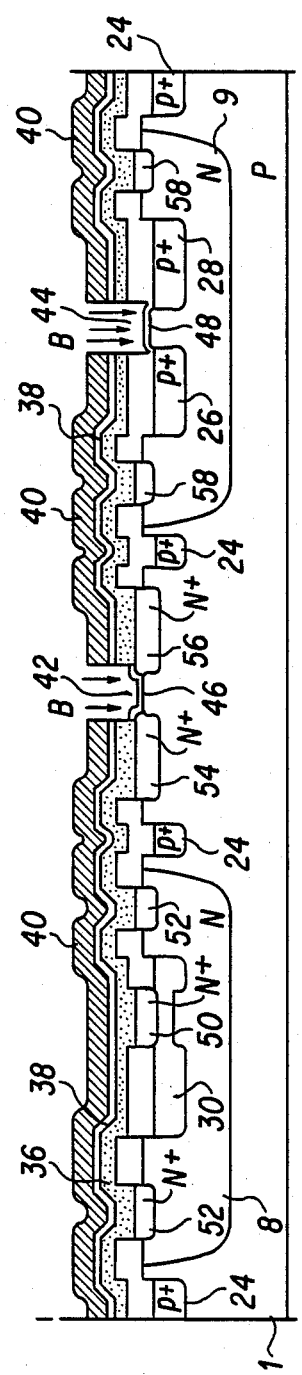

After an oxide layer 36 is deposited over the surface of the substrate 1 by a conventional CVD (Chemical Vapor Deposition) process, a nitride layer 38 is deposited over the oxide layer 36 by another LPCVD process and a fourth photoresist mask 40 is coated over portions of the nitride layer 38, openings 42, 44 are made by a convention photolithography process as shown in FIG. 8. The etching away of the oxide and nitride layers 36, 38 in the openings provides for gate insulators for the NMOS FET and PMOS FET.

After this, the fourth photoresist mask 40 is removed with a plasma, as shown in FIG. 8a, and gate oxide layers 46, 48 of about 400° Å thickness are formed in the openings 42, 44 (FIG. 8) by pyrogenic oxidation at about 850° C. in an H$_2$ and O$_2$ atmosphere for shallow openings and, thus, junction-depths of the emitter and base of the NPN transistor. In this process, if the base and function-opening depths are deep, the gate oxide layers 46, 48 can be formed by a conventional dry oxidation process.

Here, therefore, the purpose of covering the oxide layer 36 with the nitride layer 38 is to prevent the pyrogenic oxidation of the oxide layer 36 at the emitter 50 of NPN transistor during the pyrogenic oxidation for the gate insulator oxide layers 46, 48 of the NMOS FET and PMOS FET. The desirability of this is easily understood in that, for a high frequency transistor, the emitter depth should be extremely shallow. It should be noted, however, that if the emitter junction is relatively deep, it is possible to form the fourth photoresist mask 40 over the oxide layer 36 without the nitride layer 38 when the openings 42, 44 for the gate insulator of the NMOS FET and PMOS FET are formed.

Moreover, the As implanted regions 32 are activated by the processing steps for gate oxide layers 46, 48. Thus, as also shown in FIG. 8a, the N+ collector contact 52 and N+ emitter 50 the NPN transistor substrate region 8, the contacts 58 for feeding back bias to the PMOS FET in region 9 and the source and drain 54, 56 of the NMOS FET in the region 21 are formed in this way. The contact areas 58 are formed by opening the oxide surrounding the source and drain 26, 28 of the PMOS FET in the substrate region 9.

After forming the gate oxide layers 46, 48 as stated above, the process steps for controlling the threshold voltages of the PMOS FET and NMOS FET can be done, if needed. That is to say, after forming the gate oxide layers 46, 48, a boron implantation with energy of about 30 KeV and a dose of about $10^{11}$ ions/cm$^2$ can be performed at the openings 42, 44 performed (FIG. 8), as shown in FIG. 8a.

Figure 9:
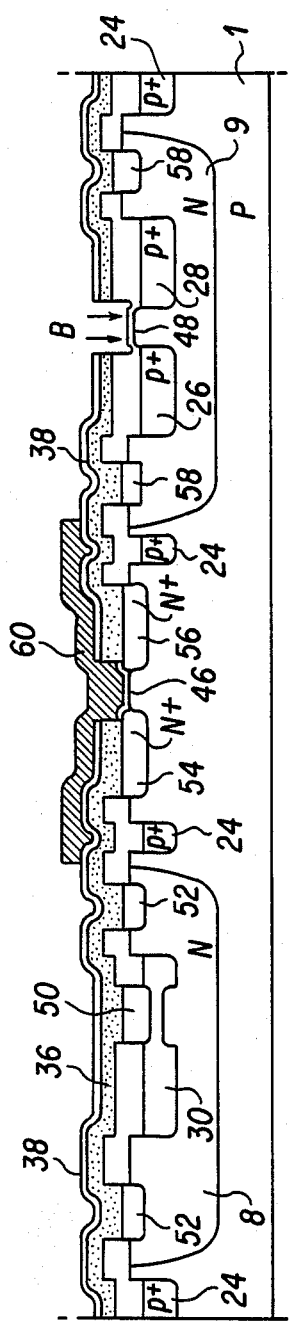

A fifth photoresist mask 60 is then formed over the channel region at 46 of the NMOS FET as shown in FIG. 9. The last-described boron implantation is then performed again, sequentially, this time with an energy of about 30KeV and a dose of about $10^{11}$ ions/cm$^2$.

Figure 10:
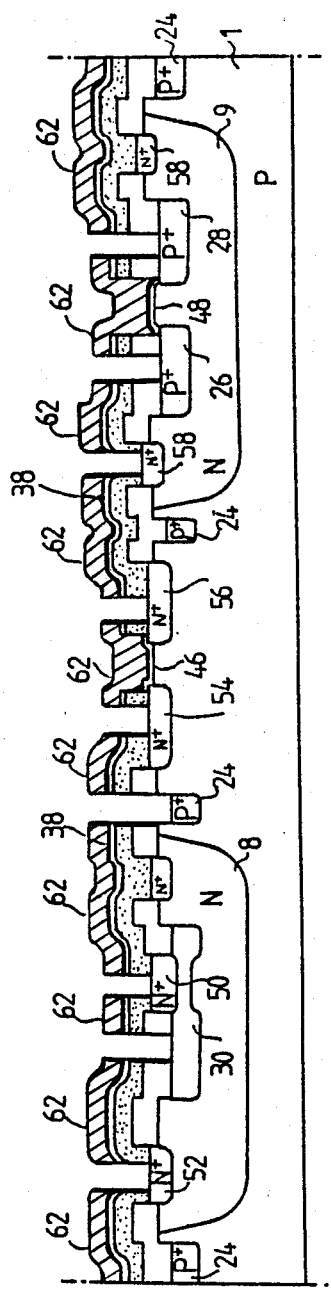

After removing the fifth photoresist mask 60, a thermal treatment is performed to activate the implanted boron and to increase the density of CVD-deposited oxide layer 36. This treatment is performed at about 920° C. in an N$_2$ atmosphere for about 120 minutes. After this, the threshold voltages of the PMOS FET and NMOS FET will be −0.75 volt and +0.75 volt respectively. After then coating a sixth photoresist 62 over the surfaces for the contact openings for the collector 52, base 30 and emitter 50 of the NPN transistor, the source and drain 54, 56 of the NMOS FET, the contact 58 and source and drain 26, 28 of the PMOS FET as shown in FIGS. 1 and 10, the channel stopper 24 is formed by photolithography using the sixth photoresist 62 as an etching mask.

Figure 11:
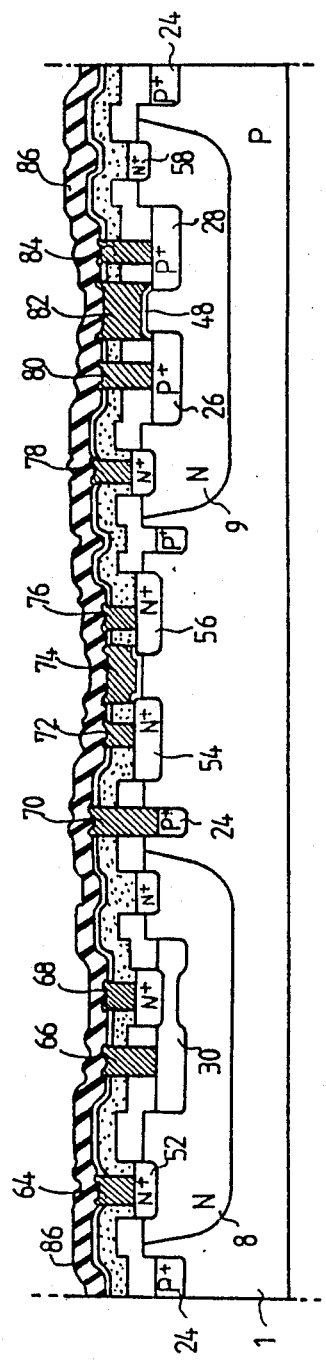

After then removing the sixth photoresist mask, Al electrodes are deposited in vacuum and formed by photolithography, sequentially, into the collector electrode 64, emitter electrode 68 and base electrode 66 of the NPN transistor; the electrode 70 to feed the back bias to the substrate 1, the source electrode 72, the gate electrode 74 and the drain electrode 76 of the NMOS FET; and the electrode 78 to feed the back bias to the substrate region 9, the source electrode 80, the gate electrode 82, and the drain electrode 84 of the PMOS FET, as shown in FIG. 11. Then a passivation layer 86 of the PSG, to protect the above-described semiconductor system, is formed thereover, as also in FIG. 11.

As explained in detail above, the method of fabricating a BiCMOS of this invention introduces the advantage of decreasing the number of steps of the process as compared to the known process also described above, decreasing production cost and stabilizing the threshold voltage by providing clean gate oxide. By minimizing the number of process steps, only a total of 8 masks are required for forming the electrodes, exposing their pads for bonding after forming the passivation layer on the device and controlling threshold voltage.

We claim:

1. A method for fabricating a BiCMOS device, in which said device has a Si substrate of a first conductivity in which there is formed a first substrate region of a second conductivity for a bipolar transistor, a second substrate region of said second conductivity for a first MOSFET, having a source and drain of the first conductivity, and in which a part of said Si substrate is to be formed to provide a second MOSFET which has a source and drain of the second conductivity, comprising the steps of :
    (a) providing a masking layer formed by a first oxide layer and a nitride layer over the Si substrate of first conductivity;
    (b) providing a mask over said masking layer to mask a collector contact region and an emitter region of the bipolar transistor, and the source and drain of the first MOSFET, and the contact region of the second MOSFET;
    (c) removing portions of the masking layer which are not masked during the step(b);
    (d) removing the mask over the masking layer;
    (e) forming a second oxide layer n the first substrate region revealed during the previous steps and on the second substrate region and on the Si substrate;
    (f) forming a mask on the second oxide layer to produce a channel stopper region on said Si substrate of the first conductivity and a base of the bipolar transistor and the source and drain of the first MOSFET;
    (g) removing the unmasked portion of the second oxide layer;
    (h) ion implanting through the region revealed in step(f) to form the base, the source, drain and the channel stopper region;
    (i) removing the mask and forming a third oxide layer on the region without said masking layer and the implanted impurities are simultaneously activated;
    (j) performing ion implantation on the collector contact and emitter of the bipolar transistor and a contact region of the first MOSFET and the source and drain of the second MOSFET after removing the masking layer therefrom;
    (k) depositing an oxide layer over the substrate surface;
    (l) forming a mask and removing the oxide layer on the gate region of the first and second MOSFET;
    (m) depositing a gate oxide in the exposed gate region after removing the mask of step(1);
    (n) providing a thermal treatment for activating the implanted impurities and for increasing the density of the oxide layer deposited during the step(k);
    (o) making openings for the contacts of the emitter, base and collector of the bipolar transistor and the contacts of the sources and drains of the first and second MOSFET, and the body contact for the channel stopper;
    (p) interconnecting the openings by a conductor; and
    (q) forming a passivation layer and making an opening therein to form a pad for wire bonding thereto.

2. A method as claimed in claim 1 in which a nitride layer is formed on the oxide layer after the step(k).

3. A method as claimed in claim 1 in which the ion implantation is processed for adjusting the threshold voltages after the step(m).

4. A method as claimed in claim 3 in which said ion implantation process is provided for adjusting the threshold voltage of the NMOSFET and the PMOSFET, and the ion implantation for adjusting the threshold voltage of PMOSFET is thereafter processed.

* * * * *